(12) United States Patent
Yang et al.

(10) Patent No.: US 10,950,809 B2
(45) Date of Patent: Mar. 16, 2021

(54) FLEXIBLE DISPLAY PANEL HAVING A PHOTORESIST SUPPORTING ELEMENT

(71) Applicant: Wuhan China Star Optoelectronics Semiconductor Display Technology Co., Ltd., Wuhan (CN)

(72) Inventors: Cheng Yang, Wuhan (CN); Wei Wang, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/472,898

(22) PCT Filed: Apr. 1, 2019

(86) PCT No.: PCT/CN2019/080888
§ 371 (c)(1),
(2) Date: Jun. 24, 2019

(87) PCT Pub. No.: WO2020/124861
PCT Pub. Date: Jun. 25, 2020

(65) Prior Publication Data
US 2020/0203640 A1    Jun. 25, 2020

(30) Foreign Application Priority Data
Dec. 21, 2018 (CN) .......................... 201811573985.1

(51) Int. Cl.
H01L 51/00 (2006.01)
H01L 51/56 (2006.01)
(Continued)

(52) U.S. Cl.
CPC ...... *H01L 51/0097* (2013.01); *H01L 27/3246* (2013.01); *H01L 27/3248* (2013.01);
(Continued)

(58) Field of Classification Search
CPC . H01L 51/0097; H01L 51/0021; H01L 51/56; H01L 27/3246; H01L 27/3248;
(Continued)

(56) References Cited

U.S. PATENT DOCUMENTS 9,818,814 B2 * 11/2017 Park .................... H01L 27/3258
9,923,175 B2 *  3/2018 Kim .................... H01L 27/1248
(Continued)

FOREIGN PATENT DOCUMENTS

| CN | 103311265 | 9/2013 |
| CN | 105551377 | 5/2016 |

(Continued)

*Primary Examiner* — Ida M Soward

(57) ABSTRACT

The present invention provides a flexible display panel and a manufacturing method thereof. The flexible display panel includes a flexible substrate, a thin film transistor, a planarization layer having a non-through groove, an anode layer, a pixel defining layer having a through groove, and a photoresist supporting element. The present invention utilizes a patterning structure of the pixel defining layer and the planarization layer to reduce internal stress of the flexible substrate, so as to improve dynamic bending performance of the flexible substrate.

14 Claims, 3 Drawing Sheets

(51) Int. Cl.
*H01L 27/32* (2006.01)
*H01L 51/52* (2006.01)
*H01L 27/12* (2006.01)

(52) U.S. Cl.
CPC ...... *H01L 27/3258* (2013.01); *H01L 51/0021* (2013.01); *H01L 51/56* (2013.01); *H01L 27/1218* (2013.01); *H01L 27/1248* (2013.01); *H01L 27/1262* (2013.01); *H01L 27/3283* (2013.01); *H01L 51/5206* (2013.01); *H01L 2227/323* (2013.01); *H01L 2251/5338* (2013.01)

(58) Field of Classification Search
CPC ............ H01L 27/3258; H01L 27/3283; H01L 27/3295
See application file for complete search history.

(56) References Cited

U.S. PATENT DOCUMENTS

| | | | | |
|---|---|---|---|---|
| 10,056,036 | B2* | 8/2018 | Hong | G09G 3/3291 |
| 10,199,602 | B2* | 2/2019 | Choi | H01L 51/5253 |
| 10,242,975 | B2* | 3/2019 | Kim | H01L 51/0097 |
| 10,418,430 | B2* | 9/2019 | Choi | H01L 51/5228 |
| 10,510,818 | B2* | 12/2019 | Lu | H01L 51/5228 |
| 10,580,847 | B2* | 3/2020 | Um | H01L 27/3276 |
| 10,606,391 | B2* | 3/2020 | Lin | H01L 25/167 |
| 10,644,084 | B2* | 5/2020 | Lhee | H01L 27/3279 |
| 2008/0067932 | A1* | 3/2008 | Baek | H01L 27/3276 313/509 |
| 2008/0180024 | A1* | 7/2008 | Kwon | H01L 27/3244 313/504 |
| 2016/0240603 | A1* | 8/2016 | Park | H01L 27/3211 |
| 2017/0194599 | A1* | 7/2017 | Furuie | H01L 51/5012 |
| 2018/0033998 | A1* | 2/2018 | Kim | H01L 27/3246 |
| 2018/0122877 | A1* | 5/2018 | Beak | H01L 27/3262 |
| 2019/0095007 | A1* | 3/2019 | Jeong | G06F 1/1643 |
| 2019/0097162 | A1* | 3/2019 | Wang | H01L 27/3246 |
| 2019/0131365 | A1* | 5/2019 | Jung | H01L 51/5246 |
| 2019/0259967 | A1* | 8/2019 | Yang | H01L 51/0023 |
| 2020/0136065 | A1* | 4/2020 | Li | B32B 37/12 |
| 2020/0243574 | A1 | 7/2020 | Tian et al. | |

FOREIGN PATENT DOCUMENTS

| | | |
|---|---|---|
| CN | 106601133 | 4/2017 |
| KR | 10-2014-0080235 | 6/2014 |

* cited by examiner

FLEXIBLE DISPLAY PANEL HAVING A PHOTORESIST SUPPORTING ELEMENT

RELATED APPLICATIONS

This application is a National Phase of PCT Patent Application No. PCT/CN2019/080888 having International filing date of Apr. 1, 2019, which claims the benefit of priority of Chinese Patent Application No. 201811573985.1 filed on Dec. 21, 2018. The contents of the above applications are all incorporated by reference as if fully set forth herein in their entirety.

FIELD AND BACKGROUND OF THE INVENTION

The present invention relates to a display field, and particularly, to a flexible display panel and a manufacturing method thereof.

With development of display technology, display techniques are ever-changing, wherein organic light emitting diodes (OLEDs) are acclaimed as a rising star of display technology due to advantages of thin thickness, being self-luminous, rich colors, and being bendable. In a display panel field, OLEDs have received great attention from academia and industry because of their great potential in solid-state lighting and flat panel displaying. OLED panels can be made lighter and thinner, and thus flexible display technology will be a future development trend.

OLEDs have been widely increasingly used due to advantages of being light in weight, being self-luminous, wide viewing angles, low driving voltages, low luminous efficiency, low power consumption, and quick response times. In particular, flexible OLED display devices have become a main subject of research and development in the field of display technology because of their characteristics of being bendable and easy to carry.

However, current OLED substrates tend to produce excessive internal stress during bending, resulting in uneven display performance of the OLED substrates or damages to the OLED substrates. Therefore, how to improve bending resistance properties of the OLED substrates is an important issue in development of current flexible substrates.

SUMMARY OF THE INVENTION

In order to overcome a technical problem that OLED substrates tend to produce excessive internal stress during bending, resulting in uneven display performance of OLED substrates or damages to OLED substrates, the present invention provides a flexible display panel, comprising a flexible substrate; a thin film transistor disposed on the flexible substrate; a planarization layer disposed on the thin film transistor, wherein the planarization layer comprises a non-through groove; an anode layer disposed on the planarization layer; a pixel defining layer disposed on the planarization layer, wherein the pixel defining layer comprises a through groove, and the pixel defining layer defines a pixel area and a non-pixel area disposed adjacent to the pixel area; and a photoresist supporting element disposed on the pixel defining layer; wherein the non-through groove of the planarization layer is disposed corresponding to the through groove of the pixel defining layer.

According to the flexible display panel of an embodiment of the present invention, the through groove of the pixel defining layer is disposed in the non-pixel area.

According to the flexible display panel of an embodiment of the present invention, a bottom of the non-through groove of the planarization layer is flat.

According to the flexible display panel of an embodiment of the present invention, the non-through groove of the planarization layer is defined by a translucent mask.

According to the flexible display panel of an embodiment of the present invention, the non-through groove of the planarization layer is a non-through hole.

According to the flexible display panel of an embodiment of the present invention, the through groove of the pixel defining layer is a through hole.

The present invention further provides a flexible display panel, comprising a flexible substrate; a thin film transistor disposed on the flexible substrate; a planarization layer disposed on the thin film transistor and comprising a non-through groove; an anode layer disposed on the planarization layer; a pixel defining layer disposed on the planarization layer, wherein the pixel defining comprises a through groove; and a photoresist supporting element disposed on the pixel defining layer.

According to the flexible display panel of an embodiment of the present invention, the pixel defining layer defines a pixel area and a non-pixel area disposed adjacent to the pixel area.

According to the flexible display panel of an embodiment of the present invention, the through groove of the pixel defining layer is disposed in the non-pixel area.

According to the flexible display panel of an embodiment of the present invention, the non-through groove of the planarization layer is disposed corresponding to the through groove of the pixel defining layer.

According to the flexible display panel of an embodiment of the present invention, a bottom of the non-through groove of the planarization layer is flat.

According to the flexible display panel of an embodiment of the present invention, the non-through groove of the planarization layer is defined by a translucent mask.

According to the flexible display panel of an embodiment of the present invention, the non-through groove of the planarization layer is a non-through hole.

According to the flexible display panel of an embodiment of the present invention, the through groove of the pixel defining layer is a through hole.

The present invention further provides a method of manufacturing a flexible display panel, comprising providing a flexible substrate; forming a thin film transistor on the flexible substrate; forming a planarization layer on the thin film transistor through a photolithography process, and forming a non-through groove on the planarization layer by a translucent mask; depositing an anode layer on the planarization layer; forming a pixel defining layer on the planarization layer, and forming a through groove on the pixel defining layer through a photolithography process; and forming a photoresist supporting element on the pixel defining layer through a photolithography process.

In comparison with the prior art, the embodiment of the present invention is to provide a flexible display panel and a manufacturing method thereof to overcome the above-mentioned technical problem. The flexible display panel of the embodiment of the present invention utilizes a patterning structure of the pixel defining layer and the planarization layer to reduce internal stress of the flexible substrate, so as to improve dynamic bending performance of the flexible substrate.

DESCRIPTION OF SPECIFIC EMBODIMENTS OF THE INVENTION

Figure 1:
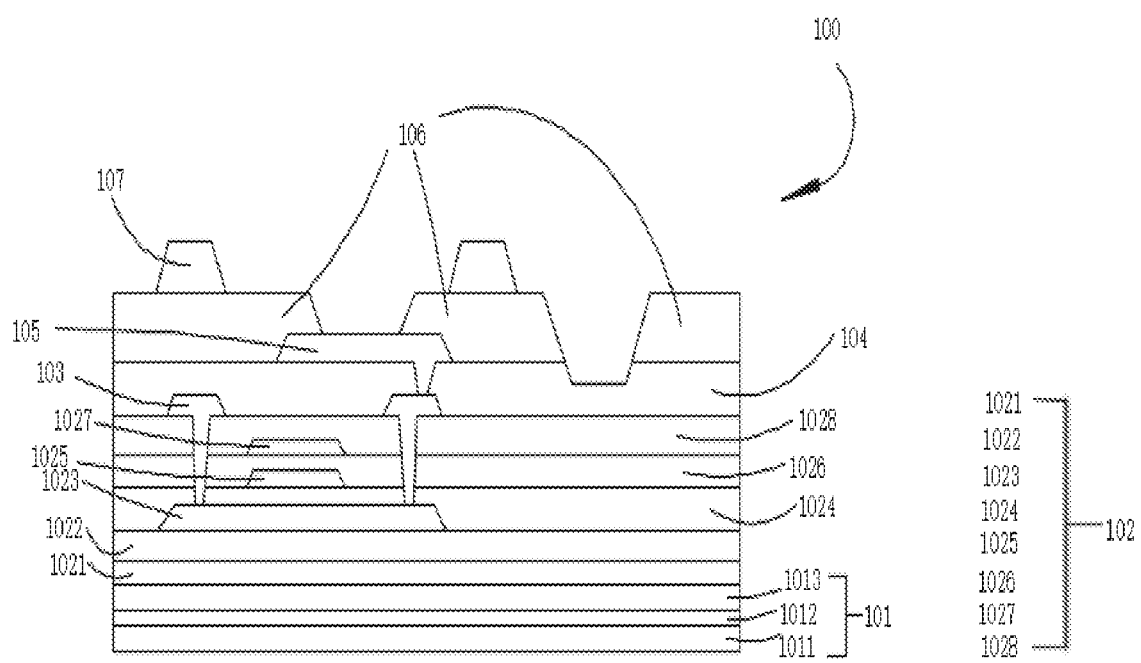
FIG. 1 is a schematic cross-sectional view of a flexible display panel of an embodiment of the present invention.

The following description of the various embodiments is referring to the accompanying drawings, and is provided to illustrate the specific embodiments of present disclosure.

The preferred embodiments of the present disclosure are described hereinafter along with the accompanying drawings for exemplifying and clarifying the above-mentioned and other objects, features, and advantages of the present disclosure in detail. Furthermore, directional terms mentioned in the present disclosure, such as upper, lower, top, bottom, front, rear, left, right, inner, outer, lateral, peripheral, central, horizontal, lateral, vertical, longitudinal, axial, radial, top or bottom layer, etc., are only directions by referring to the accompanying drawings, and thus the used directional terms are used to describe and understand the present disclosure, but the present disclosure is not limited thereto. In the drawings, elements with similar structures are labeled with like reference numerals.

The present invention is aimed to overcome problems of conventional flexible display panels that the flexible display panels are prone to damage because of excessive internal stress of substrates after bending, thereby adversely affecting display quality of flexible display panels.

FIG. 1 is a cross-sectional view of a flexible display panel 100 of an embodiment of the present invention.

As shown in FIG. 1, the flexible display panel 100 of the embodiment of the present invention includes a flexible substrate 101, a thin film transistor 102, a source and drain layer 103, a planarization layer 104, an anode layer 105, a pixel defining layer 106, and a photoresist supporting element 107.

Figure 2:
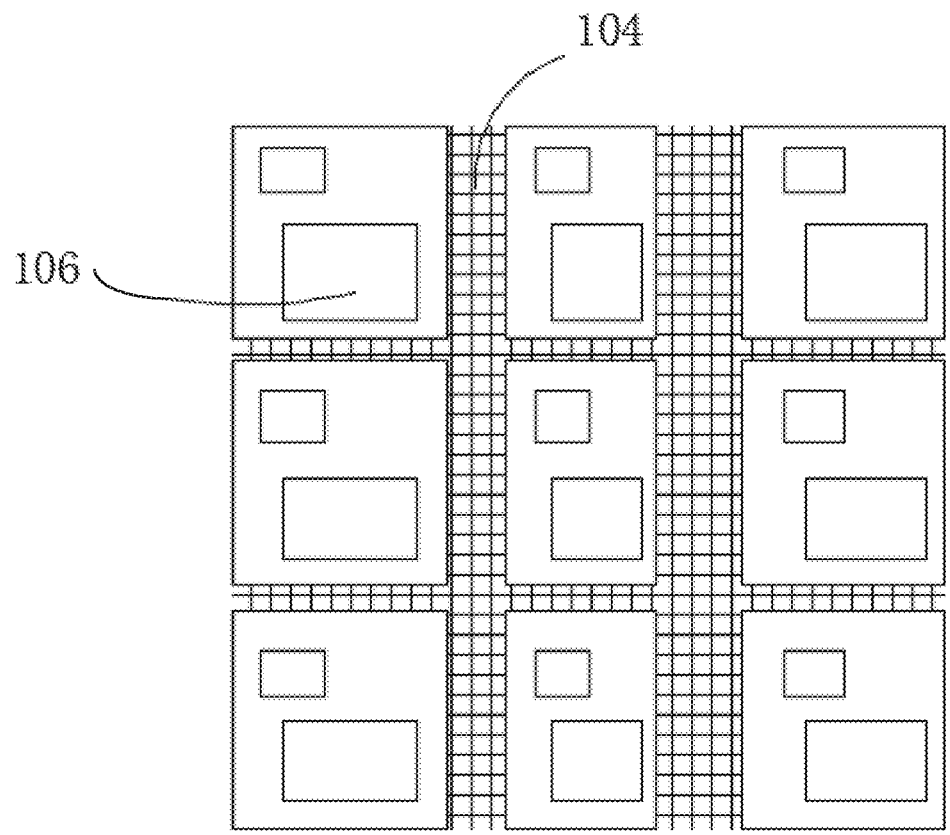
FIG. 2 is a top plan view showing a planarization layer and a pixel defining layer configured with strip grooves in accordance with an embodiment of the present invention.

As shown in FIG. 1 and FIG. 2, the flexible substrate 101 includes a first polyimide layer 1011, an isolating layer 1012, and a second polyimide layer 1013. The isolating layer 1012 covers the first polyimide layer 1011. The isolating layer 1012 is capable of preventing permeation of water and oxygen so as to provide the flexible substrate 101 with a great capability to block water and oxygen. The second polyimide layer 1013 is disposed on the isolating layer 1012, thereby to finalize formation of the flexible substrate 101.

The thin film transistor 102 is disposed on the flexible substrate 101. In the embodiment of the present invention, a method of manufacturing the thin film transistor 102 includes: depositing a first buffer layer 1021 (also referring to a main buffer, MB) on the flexible substrate 101. Deposit a second buffer layer 1022 on the first buffer layer 1021, and deposit an active layer 1023 on the second buffer layer 102 after formation of the second buffer layer 1022. Then, form a first gate insulating layer 1024 on the active layer 1023. Deposit a first gate layer 1025 on the first gate insulating layer 1024. Deposit a second gate insulating layer 1026 on the first gate layer 1025 after formation of the first gate layer 1025. Then, deposit a second gate layer 1027 on the second gate insulating layer 1026. Deposit an insulating layer 1028 on the second gate layer 1027, and then form the source and drain layer 103 on the insulating layer 1028.

After forming the source and drain layer 103, the planarization layer 104 is formed by a photolithography process. The planarization layer 104 is formed by a translucent mask to define a partially hollowed area functioning as a non-through groove of the planarization layer 104, wherein a bottom of the groove is flat.

Then, the anode layer 105 is deposited, so that an anode electrode is defined by a photolithography process. After formation of the anode layer 105, the pixel defining layer 106 is formed on the anode layer 105. The pixel defining layer 106 defines a pixel area and a non-pixel area by a photolithography process. A portion corresponds to the non-through groove of the planarization layer 104 in the non-pixel area is hollowed through a photolithography process to form a through groove in the non-pixel area. The through groove in the non-pixel area of the pixel defining layer 106 is corresponding to the non-through groove of the planarization layer 104. Finally, the photoresist supporting element 107 is defined by a photolithography process, and the photoresist supporting element 107 is disposed on the pixel defining layer 106.

Figure 3:
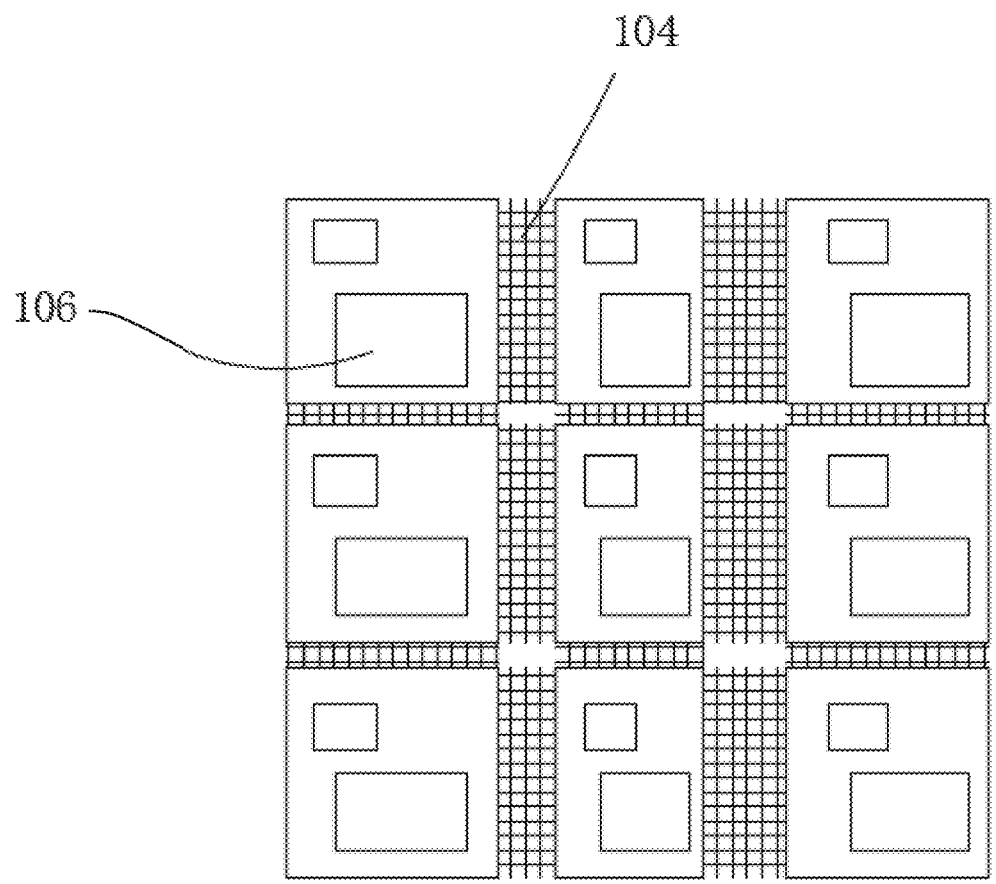
FIG. 3 is a top plan view showing a planarization layer and a pixel defining layer configured with holes in accordance with an embodiment of the present invention.

As shown in FIG. 1 and FIG. 3, the flexible display panel 100 of an embodiment of the present invention includes a flexible substrate 101, a thin film transistor 102, a source and drain layer 103, a planarization layer 104, an anode layer 105, a pixel defining layer 106, and a photoresist supporting element 107.

As shown in FIG. 1, the flexible substrate 101 includes a first polyimide layer 1011, an isolating layer 1012, and a second polyimide layer 1013. The isolating layer 1012 covers the first polyimide layer 1011. The isolating layer 1012 is capable of preventing permeation of water and oxygen so as to provide the flexible substrate 101 with a great capability to block water and oxygen. The second polyimide layer 1013 is disposed on the isolating layer 1012, thereby to finalize formation of the flexible substrate 101.

The thin film transistor 102 is disposed on the flexible substrate 101. In the embodiment of the present invention, a method of manufacturing the thin film transistor 102 includes: depositing a first buffer layer 1021 (also referring to a main buffer, MB) on the flexible substrate 101. Deposit a second buffer layer 1022 on the first buffer layer 1021, and deposit an active layer 1023 on the second buffer layer 102 after formation of the second buffer layer 1022. Then, form a first gate insulating layer 1024 on the active layer 1023. Deposit a first gate layer 1025 on the first gate insulating layer 1024. Deposit a second gate insulating layer 1026 on the first gate layer 1025 after formation of the first gate layer 1025. Then, deposit a second gate layer 1027 on the second gate insulating layer 1026. Deposit an insulating layer 1028 on the second gate layer 1027, and then form the source and drain layer 103 on the insulating layer 1028.

After forming the source and drain layer 103, the planarization layer 104 is formed by a photolithography process. The planarization layer 104 is formed by a translucent mask to define a partially hollowed area functioning as a non-through hole of the planarization layer 104, wherein a bottom of the hole is flat.

Then, the anode layer 105 is deposited, so that an anode electrode is defined by a photolithography process. After formation of the anode layer 105, the pixel defining layer 106 is formed on the anode layer 105. The pixel defining layer 106 defines a pixel area and a non-pixel area by a photolithography process. A portion corresponds to the non-through hole of the planarization layer 104 in the non-pixel area is hollowed through a photolithography process to form a through hole in the non-pixel area. The through hole in the non-pixel area of the pixel defining layer 106 is corresponding to the non-through hole of the planarization layer 104. Finally, the photoresist supporting element 107 is defined by a photolithography process, and the photoresist supporting element 107 is disposed on the pixel defining layer 106.

The present disclosure has been shown and described with respect to one or more embodiments, and equivalents and modifications will be apparent to those of ordinary skill in the art. The present disclosure includes all such modifications and variations, and is only limited by the scope of the appended claims. In particular, with respect to the various functions performed by the above-described components, the terms used to describe such components are intended to correspond to any component that performs the specified function of the component (e.g. functionally equivalent, unless otherwise indicated). It is not equivalent in structure to the disclosed structure for performing the functions in the exemplary implementation of the present specification shown herein. Moreover, although specific features of the specification have been disclosed with respect to only one of several implementations, such features may be combined with one or more features of other implementations that may be desirable and advantageous for a given or particular application. Furthermore, the terms "comprising," "having," "having," or "include" or "comprising" are used in the particular embodiments or claims, and such terms are intended to be encompassed in a manner similar to the term "comprising."

The above is only preferred embodiments of the present disclosure. It should be noted that a number of modifications and refinements may be made by those skilled in the art without departing from the principles of the present disclosure, and such modifications and refinements are also considered to be within the scope of the present disclosure.

What is claimed is:

1. A flexible display panel; comprising:
   a flexible substrate;
   a thin film transistor disposed on the flexible substrate;
   a planarization layer disposed on the thin film transistor, wherein the planarization layer comprises a non-through groove;
   an anode layer disposed on the planarization layer;
   a pixel defining layer disposed on the planarization layer, wherein the pixel defining layer comprises a through groove, the pixel defining layer defining a pixel area and a non-pixel area disposed adjacent to the pixel area; and
   a photoresist supporting element disposed on the pixel defining layer;
   wherein the non-through groove of the planarization layer is disposed corresponding to the through groove of the pixel defining layer.

2. The flexible display panel of claim 1, wherein the through groove of the pixel defining layer is disposed in the non-pixel area.

3. The flexible display panel of claim 1, wherein a bottom of the non-through groove of the planarization layer is flat.

4. The flexible display panel of claim 3, wherein the non-through groove of the planarization layer is defined by a translucent mask.

5. The flexible display panel of claim 1, wherein the non-through groove of the planarization layer is a non-through hole.

6. The flexible display panel of claim 1, wherein the through groove of the pixel defining layer is a through hole.

7. A flexible display panel; comprising:
   a flexible substrate;
   a thin film transistor disposed on the flexible substrate;
   a planarization layer disposed on the thin film transistor and comprising a non-through groove;
   an anode layer disposed on the planarization layer;
   a pixel defining layer disposed on the planarization layer, wherein the pixel defining layer comprises a through groove; and
   a photoresist supporting element disposed on the pixel defining layer.

8. The flexible display panel of claim 7, wherein the pixel defining layer defines a pixel area and a non-pixel area disposed adjacent to the pixel area.

9. The flexible display panel of claim 8, wherein the through groove of the pixel defining layer is disposed in the non-pixel area.

10. The flexible display panel of claim 7, wherein the non-through groove of the planarization layer is disposed corresponding to the through groove of the pixel defining layer.

11. The flexible display panel of claim 10, wherein a bottom of the non-through groove of the planarization layer is flat.

12. The flexible display panel of claim 11, wherein the non-through groove of the planarization layer is defined by a translucent mask.

13. The flexible display panel of claim 7, wherein the non-through groove of the planarization layer is a non-through hole.

14. The flexible display panel of claim 7, wherein the through groove of the pixel defining layer is a through hole.

* * * * *